United States Patent
Bae et al.

(10) Patent No.: US 9,394,509 B2
(45) Date of Patent: Jul. 19, 2016

(54) CLEANING SOLUTION COMPOSITION AND METHOD OF CLEANING SEMICONDUCTOR DEVICE USING THE SAME

(71) Applicant: Samsung Electronics Co., Ltd., Suwon-si (KR)

(72) Inventors: Sang-Won Bae, Suwon-si (KR); Yong-Sun Ko, Suwon-si (KR); Seok-Hoon Kim, Seongnam-si (KR); In-Gi Kim, Hwaseong-si (KR); Jung-Min Oh, Incheon (KR); Kun-Tack Lee, Suwon-si (KR); Hyo-San Lee, Hwaseong-si (KR); Ji-Hoon Jeong, Suwon-si (KR); Yong-Jhin Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 14/542,973

(22) Filed: Nov. 17, 2014

(65) Prior Publication Data

US 2015/0299629 A1    Oct. 22, 2015

(30) Foreign Application Priority Data

Apr. 16, 2014  (KR) .................. 10-2014-0045382

(51) Int. Cl.
| | | |
|---|---|---|
| H01L 21/20 | (2006.01) | |
| C11D 11/00 | (2006.01) | |
| H01L 21/02 | (2006.01) | |
| C11D 7/08 | (2006.01) | |
| C11D 7/50 | (2006.01) | |
| C11D 7/10 | (2006.01) | |

(52) U.S. Cl.
CPC .............. *C11D 11/0047* (2013.01); *C11D 7/08* (2013.01); *C11D 7/10* (2013.01); *C11D 7/5022* (2013.01); *H01L 21/02068* (2013.01)

(58) Field of Classification Search
None
See application file for complete search history.

(56) References Cited

U.S. PATENT DOCUMENTS

| | | | |
|---|---|---|---|
| 7,052,627 B1 | 5/2006 | Kezuka et al. | |
| 2011/0073484 A1* | 3/2011 | Kawagoshi | C23C 22/50 205/183 |
| 2012/0157368 A1 | 6/2012 | Mizuta et al. | |

FOREIGN PATENT DOCUMENTS

| | | | |
|---|---|---|---|
| JP | 199850647 A | * | 2/1998 |
| KR | 1020000055594 | | 9/2000 |
| KR | 10-0510446 B1 | | 8/2005 |

* cited by examiner

*Primary Examiner* — Calvin Choi
(74) *Attorney, Agent, or Firm* — Myers Bigel & Sibley, P.A.

(57) ABSTRACT

A cleaning solution composition includes an organic solvent in which a metal fluoride does not dissolve, at least one fluoride compound that generates bifluoride ($HF_2^-$), and deionized water, wherein the deionized water may be included in a concentration of 1.5 wt % or lower based on the total weight of the cleaning solution composition.

15 Claims, 6 Drawing Sheets

CLEANING SOLUTION COMPOSITION AND METHOD OF CLEANING SEMICONDUCTOR DEVICE USING THE SAME

CROSS-REFERENCE TO RELATED APPLICATION

This application claims priority under 35 U.S.C. §119 to Korean Patent Application No. 10-2014-0045382 filed on Apr. 16, 2014, the disclosure of which is hereby incorporated by reference in its entirety.

FIELD

Embodiments relate to a cleaning solution composition and a method of cleaning a semiconductor device using the same, and more particularly, to a cleaning solution composition capable of removing contaminants generated during a semiconductor device manufacturing process, and a method of cleaning a semiconductor device using the same.

BACKGROUND

As semiconductor devices are highly integrated, a low-resistance metal is used for a wiring pattern such as a gate or a bit line, and a contact pattern configured to connect wirings. The reliability of the semiconductor device can be reduced by remaining contaminants on the metal layer of the wiring pattern or the contact pattern, such as an etching by-product generated during a semiconductor device manufacturing process.

SUMMARY

Embodiments provide a cleaning solution composition capable of preventing damage to a metal layer.

Other embodiments provide a method of cleaning a semiconductor device capable of removing contaminants generated during a semiconductor device manufacturing process without damaging a metal layer.

The embodiment may be realized by providing a cleaning solution composition including an organic solvent in which a metal fluoride does not dissolve, at least one fluoride compound that generates bifluoride ($HF_2^-$), and deionized water (DIW), wherein the deionized water may be contained in a concentration of 1.5 wt % or lower based on the total weight of the cleaning solution composition.

The organic solvent may include methyl alcohol, ethyl alcohol, propyl alcohol, or butyl alcohol.

The organic solvent may include isopropyl alcohol (($CH_3$)$_2$CHOH).

The concentration of the organic solvent may range between 98.7 and 99.6 wt % based on the total weight of the cleaning solution composition.

The fluoride compound may include hydrogen fluoride (HF) and ammonium fluoride ($NH_4F$). The HF and the $NH_4F$ may be included at a ratio of 1:1. The concentration of HF may range between 0.002 and 0.01 wt % and the concentration of $NH_4F$ may range between 0.02 and 0.05 wt % based on the total weight of the cleaning solution composition.

The fluoride compound may include ammonium hydrogen fluoride ($NH_4HF_2$).

The concentration of the deionized water may range between 0.4 and 1.25 wt % based on the total weight of the cleaning solution composition.

The other embodiment may be realized by providing a method of cleaning a semiconductor device, the method including forming a pattern including a metal layer on a substrate, and cleaning the substrate using a cleaning solution composition including an organic solvent in which a metal fluoride does not dissolve, at least one fluoride compound that generates bifluoride ($HF_2^-$), and deionized water in a concentration of 1.5 wt % or lower.

The cleaning solution composition may include 98.7 to 99.6 wt % of isopropyl alcohol (($CH_3$)$_2$CHOH), 0.002 to 0.01 wt % of HF, 0.02 to 0.05 wt % of $NH_4F$, and 0.4 to 1.25 wt % of deionized water.

The method of cleaning the semiconductor device may further include removing the cleaning solution composition remaining on the substrate by rinsing the substrate with the deionized water after cleaning the substrate.

A cleaning solution according to an embodiment comprises an organic solvent in which a metal fluoride does not dissolve, at least one fluoride compound that generates HF2, and deionized water that is contained in a concentration between 0.4 and 1.25 wt % based on the total weight of the cleaning solution composition and the concentration of the organic solvent ranges between 98.7 and 99.6 wt % based on the total weight of the cleaning solution composition.

Details of other embodiments are included in detailed explanations and the drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

The inventive concept will now be described more fully hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

The terminology used herein is for the purpose of describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Like numerals refer to like elements throughout the specification. In the drawings, the lengths and thicknesses of layers and regions may be exaggerated for clarity. In addition, it will be understood that when a first element is referred to as being "on a second element, the first element may be directly on the second element, or a third element may be interposed between the first element and the second element.

Spatially relative terms, such as "upper end," "lower end," "upper surface," "lower surface," "upper part," "lower part," and the like, may be used herein for ease of description to distinguish relative locations of elements. For example, when an upper part is used as a top in the drawing and a lower part is used as a bottom in the drawing for convenience, the upper part could be termed the lower part and the lower part could be termed the upper part without departing from the scope of the present invention.

It will be understood that, although the terms "first," "second," etc. may be used herein to describe various elements, these elements should not be limited by these terms. These terms are only used to distinguish one element from another. For example, a first element could be termed a second element, and similarly, a second element could be termed a first element, without departing from the scope of the inventive concept.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and to limit the scope of the present inventive concept.

Cleaning Solution Composition

A cleaning solution composition for a semiconductor device, in which a pattern including a metal layer, such as a gate, a bit line, a metal wiring, or a contact structure, is formed, requires the following characteristics.

First, the damage of the metal layer exposed to the cleaning solution composition should be avoided.

Second, removability of polymer by-products generated by an etching process for forming the pattern including the metal layer, for example, a polymer having a metal component and a polymer having an oxide component, should be excellent.

Third, the cleaning solution composition has an appropriate etching amount with respect to an oxide layer so that the polymer with an oxide component can be removed.

To secure the above characteristics, the cleaning solution composition in accordance with an embodiment may include an organic solvent, in which a metal fluoride does not dissolve, at least one fluoride compound that generates $HF_2^-$, and deionized water.

The organic solvent, in which a metal fluoride does not dissolve, may include methyl alcohol, ethyl alcohol, propyl alcohol, or butyl alcohol. For example, the organic solvent may include isopropyl alcohol (($CH_3$)$_2$CHOH).

The fluoride compound that generates $HF_2^-$, which acts as an oxide etchant, may include hydrogen fluoride (HF) and ammonium fluoride ($NH_4F$). In an embodiment, the HF and the $NH_4F$ may be included at a ratio of 1:1. However, the HF content and the $NH_4F$ content may be appropriately adjusted. Further, the fluoride compound that generates the $HF_2^-$ may include ammonium hydrogen fluoride ($NH_4HF_2$).

When the deionized water exceeds 1.5 wt % based on the total weight of the cleaning solution composition, a metal layer is etched. In the cleaning solution composition in accordance with the embodiment, the concentration of the deionized water may be restricted to 1.5 wt % or lower based on the total weight of the cleaning solution composition, and the organic solvent in which the metal fluoride does not dissolve may be used, thereby preventing the metal layer from being etched. For example, the cleaning solution composition in accordance with the embodiment may include 0.4 to 1.25 wt % of deionized water based on the total weight thereof.

The deionized water mixed with the fluoride compound accelerates ionization of the fluoride compound, and then generates $HF_2^-$ in which the removability of the oxide layer is excellent. The $HF_2^-$ is an active etchant having a relatively much greater reactivity compared to the HF or $F^-$. The oxide layer and the polymer with an oxide component are etched by the $HF_2^-$ generated from the fluoride compound. A metal-polymer by-product, an etching residue, and an organic contaminant peel off and dissolve in the cleaning solution composition.

Figure 1A:
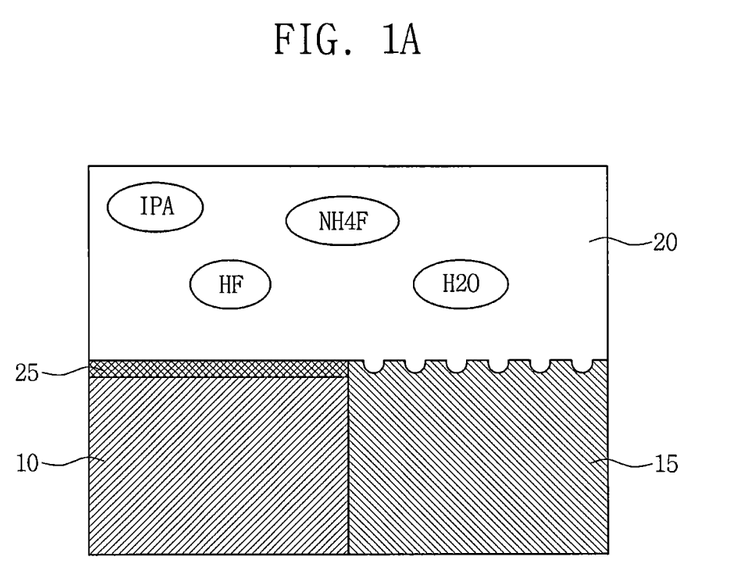
FIGS. 1A to 1C are conceptual views for describing a cleaning mechanism by a cleaning solution composition in accordance with an embodiment.
Figure 1B:
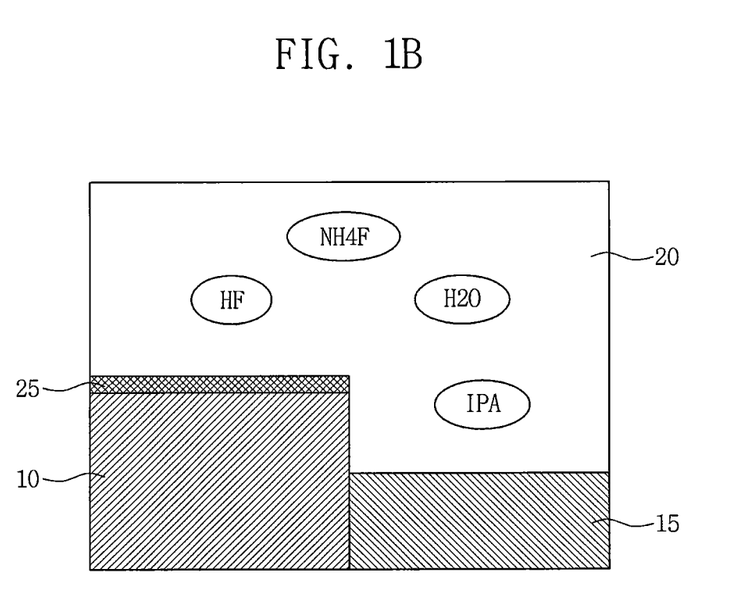
Figure 1C:
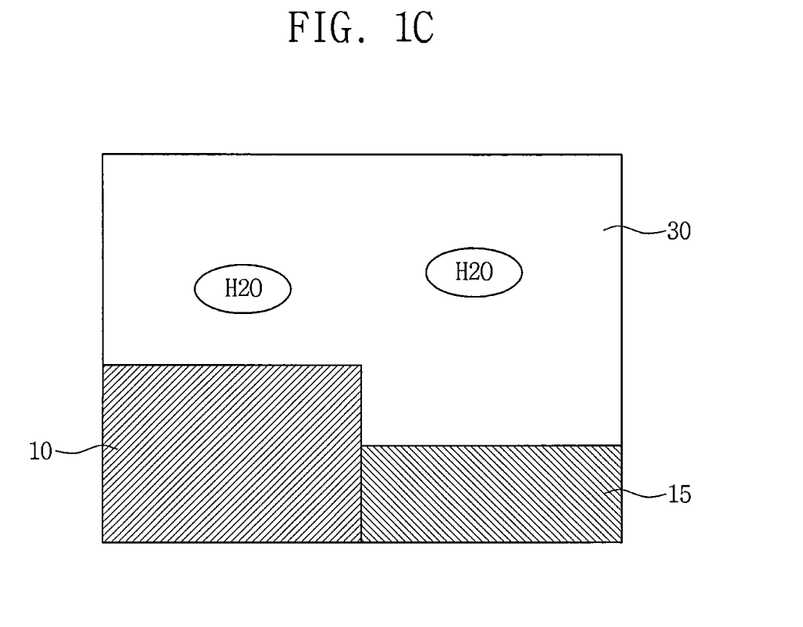

FIGS. 1A to 1C are conceptual views for describing a cleaning mechanism by a cleaning solution composition in accordance with an embodiment.

Referring to FIG. 1A, a cleaning solution composition 20 in accordance with the embodiment may include an organic solvent including isopropyl alcohol (IPA), a fluoride compound including HF and $NH_4F$, and deionized water ($H_2O$).

When the cleaning solution composition 20 in accordance with the embodiment reacts with a surface of a metal layer 10 and a surface of an oxide layer 15, the HF contained in the cleaning solution composition 20 reacts with the metal layer 10, and then a metal fluoride 25 is formed on the surface of the metal layer 10. A formation amount of the metal fluoride 25 may be controlled by the content of HF.

The metal fluoride 25 may dissolve in the deionized water and thus, may be etched. The metal fluoride 25 may not be etched and may remain on the surface of the metal layer 10 when the content of the deionized water is restricted to 1.5 wt % or lower and the organic solvent, in which the metal fluoride does not dissolve, is used. Therefore, according to the cleaning solution composition 20 in accordance with the embodiment, the metal fluoride 25 may serve to prevent etching of the underlying metal layer 10 during a cleaning process.

Referring to FIG. 1B, the HF of the cleaning solution composition 20 reacts with $H_2O$ to generate $HF_2^-$, which acts as an oxide etchant. The $HF_2^-$ is an active etchant having a relatively much greater reactivity compared to the HF or $F^-$.

The $HF_2^-$ reacts with silicon dioxide ($SiO_2$) to form a silicon tetrafluoride ($SiF_4$) on the surface of the oxide layer 15. The $SiF_4$ reacts with the HF, and dissolves in fluorosilicic acid ($H_2SiF_6$), which results in etching of the oxide layer 15. The HF may be used alone as a fluoride compound, however, an etching characteristic of the oxide layer 15 may be constantly maintained by the $HF_2^-$ generated from the $NH_4F$ when the HF and the $NH_4F$ are mixed as a fluoride compound.

Therefore, when the cleaning solution composition 20 in accordance with the embodiment reacts with the surfaces of the metal layer 10 and the oxide layer 15, while the oxide layer 15 may be etched by the $HF_2^-$, which is an oxide etchant, etching of the metal layer 10 may be prevented by the metal fluoride 25 remaining on the surface thereof.

Referring to FIG. 1C, the metal fluoride 25 remaining on the surface of the metal layer 10 may be removed by a rinse 30 including deionized water ($H_2O$). The cleaning solution composition 20 remaining on the surfaces of the metal layer 10 and the oxide layer 15 may also be fully removed by the rinse 30 including the deionized water ($H_2O$).

Hereinafter, the cleaning solution composition in accordance with the embodiment will be described in more detail through experimental examples.

In the experimental examples, a performance of the cleaning solution composition in accordance with changing isopropyl alcohol (IPA) content, HF content, ammonium fluoride ($NH_4F$) content, and deionized water ($H_2O$) content is evaluated. An experimental group 1 includes a cleaning solution composition including 97.5 wt % of IPA, 0.01 wt % of HF, 0.09 wt % of $NH_4F$, and 2.4 wt % of $H_2O$. An experimental group 2 includes a cleaning solution composition including 98.7 wt % of IPA, 0.006 wt % of HF, 0.04 wt % of $NH_4F$, and 1.22 wt % of $H_2O$. An experimental group 3 includes a cleaning solution composition including 99.4 wt % of IPA, 0.003 wt % of HF, 0.02 wt % of $NH_4F$, and 0.6 wt % of $H_2O$. A cleaning solution composition, in which sulfuric acid ($H_2SO_4$), hydrogen peroxide ($H_2O_2$), and deionized water ($H_2O$) are mixed, is prepared as a comparative group. The wt % shows a wt % of each component based on a total weight of the cleaning solution composition.

The performance of the cleaning solution composition was evaluated by the following method with respect to each cleaning solution composition.

Experimental Example 1

Evaluation of an Etching Amount of an Oxide Layer

Samples used in the experimental examples were manufactured as follows. A tetra ethyl ortho silicate (TEOS) oxide layer was deposited on a silicon substrate. A process of cleaning the oxide layer was performed using the cleaning solution compositions of the experimental groups 1 to 3 while changing a cleaning time to 30 seconds, 120 seconds, 300 seconds, and 600 seconds. Subsequently, an etching amount of the oxide layer was evaluated by measuring the thickness of the oxide layer, on which the cleaning process was performed, using thickness measurement equipment. The results are shown in Table 1.

TABLE 1

| IPA (wt %) | HF (wt %) | $NH_4F$ (wt %) | $H_2O$ (wt %) | Etching Amount of Oxide Layer (Å) | | | |
|---|---|---|---|---|---|---|---|
| | | | | 30 sec. | 120 sec. | 300 sec. | 600 sec. |
| 97.5 | 0.011 | 0.09 | 2.4 | 16.9 | 60.2 | 105.9 | 143.6 |
| 98.7 | 0.005 | 0.04 | 1.2 | 7.4 | 22.5 | 41.7 | 68.3 |
| 99.4 | 0.003 | 0.02 | 0.6 | 2.9 | 13.2 | 21.8 | 35.7 |

As shown by the results of Table 1, as the contents of HF and $NH_4F$ that generate $HF_2^-$, which is an oxide etchant, increase, the etching amount of the oxide layer increases. When the HF content exceeds 0.01 wt % and the $NH_4F$ content is greater than or equal to 0.09 wt %, the etching amount of the oxide layer increases excessively, thus, a process failure may be caused. Alternatively, when the HF content is less than 0.002 wt % and the $NH_4F$ content is less than 0.02 wt %, removability of the polymer with an oxide component may be vulnerable. According to an embodiment, the cleaning solution composition in accordance with the embodiment include 0.002 to 0.01 wt % of HF, and 0.02 to 0.05 wt % of $NH_4F$ based on the total weight thereof.

Experimental Example 2

Evaluation of an Etching Amount of a Metal Layer

Samples used in the experimental examples were manufactured as follows. A titanium aluminum (TiAl) metal layer was deposited on a silicon substrate. A process of cleaning the metal layer was performed using the cleaning solution compositions of the experimental groups 1 to 3 while changing a cleaning time to 30 seconds, 120 seconds, 300 seconds, and 600 seconds. Subsequently, an etching amount of the oxide layer was evaluated by measuring the thickness of the metal layer, on which the cleaning process was performed, using thickness measurement equipment. The results are shown in Table 2.

TABLE 2

| IPA (wt %) | HF (wt %) | $NH_4F$ (wt %) | $H_2O$ (wt %) | Etching Amount of Metal Layer (Å) | | | |
|---|---|---|---|---|---|---|---|
| | | | | 30 sec. | 120 sec. | 300 sec. | 600 sec. |
| 97.5 | 0.01 | 0.09 | 2.4 | 16.5 | 21.2 | 19.7 | 20.9 |
| 98.7 | 0.005 | 0.04 | 1.2 | 2.2 | 11.4 | 11.6 | 11.9 |
| 99.4 | 0.003 | 0.02 | 0.6 | 0.8 | 2.6 | 5.8 | 5.3 |

A metal fluoride may be formed on a surface of the metal layer by HF reacting with the metal layer, and etched by $H_2O$. The metal fluoride does not dissolve in an IPA organic solvent. As shown by the results of Table 2, as the contents of HF and $H_2O$ increase, the etching amount of the metal layer increases, otherwise, as the content of the IPA organic solvent increases, the etching amount of the metal layer decreases. The results of Table 2 show that the etching amount of the metal layer no longer increases and converges after a certain period of time, due to the metal fluoride which does not dissolve in the IPA organic solvent and remains. When the content of the $H_2O$ that dissociates a metal with a fluoride compound exceeds 1.5 wt %, etching of the metal layer excessively occurs. Therefore, in the cleaning solution composition in accordance with the embodiment, the content of the deionized water is preferably 1.5 wt % or lower based on the total weight thereof, more preferably, 0.4 to 1.25 wt %. To prevent etching of the metal layer, the content of the organic solvent configured to allow the metal fluoride to remain on the surface of the metal layer is preferably 98.7 to 99.6 wt % based on the total weight of the cleaning solution composition.

Experimental Example 3

Evaluation of an Residual Amount of a Contaminant

Samples used in the experimental examples were manufactured as follows. There was prepared a substrate on which polymer by-products of a metal component and an oxide component, an etching residue, or an organic contaminants existed by performing a dry etching process of forming a pattern including a metal layer or an ashing process of a photoresist layer. After cleaning the substrate using the cleaning solution compositions of the experimental groups 1 to 3, the residual amount of the contaminant was evaluated by examining a surface of the cleaned substrate. The results are shown in Table 3.

TABLE 3

| IPA (wt %) | HF (wt %) | NH$_4$F (wt %) | H$_2$O (wt %) | Residual Amount of Contaminant of 45 nm or more (ea) |
|---|---|---|---|---|
| 97.5 | 0.01 | 0.09 | 2.4 | >11000 |
| 98.7 | 0.005 | 0.04 | 1.2 | 30~200 |
| 99.4 | 0.003 | 0.02 | 0.6 | 0~30 |

As shown by the results of Table 3, according to the cleaning solution composition in accordance with the embodiment, the polymer with an oxide component is etched by HF$_2^-$ generated from HF and NH$_4$F, the polymer by-products of a metal component, the etching residue, and the organic contaminant delaminate and dissolve in the cleaning solution composition. However, since the NH$_4$F does not dissolve in an IPA organic solvent, the NH$_4$F may be separated from the cleaning solution composition, and then may remain on the surface of the substrate as a contaminant when the NH$_4$F is excessively added.

The following Table 4 shows etch rates of TEOS oxide layers, aluminum (Al) layers, tungsten (W) layers, and titanium aluminum (TiAl) layers, using the cleaning solution composition in accordance with the embodiment manufactured under the condition of the experimental group 3 and the cleaning solution composition of the comparison group.

TABLE 4

| Cleaning Solution Composition | TEOS Etch Rate (Å/min) | Al Etch Rate (Å/min) | W Etch Rate (Å/min) | TiAl Etch Rate (Å/min) |
|---|---|---|---|---|
| Test Group 3 | 5.88 | ~0 | ~0 | 1.6 |
| Comparison Group | 1 | 65.2 | 57~64 | >210 |

As shown in the results of Table 1, Table 2, Table 3, and Table 4, the cleaning solution composition in accordance with the embodiment including organic solvent (IPA), fluoride compounds (HF and NH$_4$F), and deionized water (H$_2$O) minimizes an etch amount of the metal layer to 5 Å or lower, and has an appropriate etching amount of the oxide layer, thus, the polymer with an oxide component may be removed. The results of Tables 1 to 4 disclose that a superior cleaning effect can be obtained when the cleaning solution composition in accordance with the embodiment is manufactured by mixing 98.7 to 99.6 wt % of organic solvent, 0.002 to 0.01 wt % of HF, 0.02 to 0.05 wt % of NH$_4$F, and 0.4 to 1.25 wt % of deionized water.

A Method of Cleaning a Semiconductor Device

A method of cleaning using the cleaning solution composition in accordance with the embodiment may be applied to all processes, in which cleaning is necessary, during a semiconductor device manufacturing process. For example, the method of cleaning in accordance with the embodiment may be applied to a cleaning process after forming a metal wiring. The metal wiring may include tungsten (W), aluminum (Al), titanium nitride (TiN), titanium aluminum (TiAl), or tantalum nitride (TaN). Further, the method of cleaning in accordance with the embodiment may be applied to a cleaning process after forming a contact hole, or a via hole.

Figure 2A:
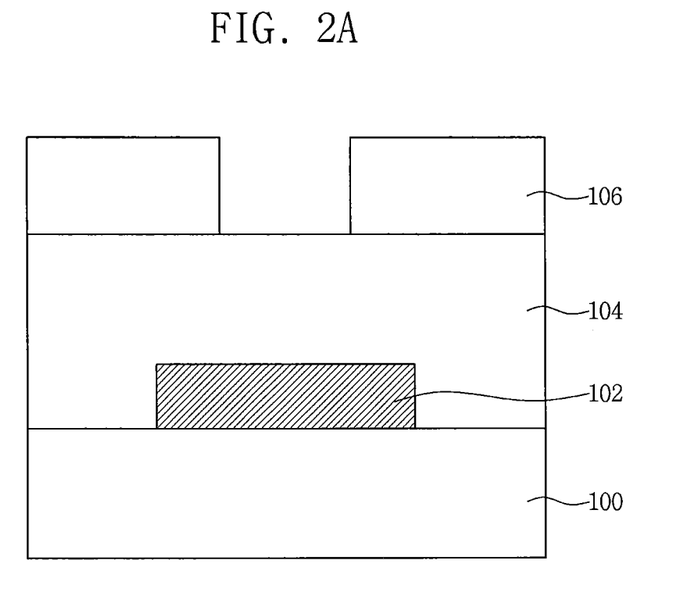
FIGS. 2A to 2C are cross-sectional views for describing a method of cleaning a semiconductor device in accordance with an embodiment.
Figure 2B:
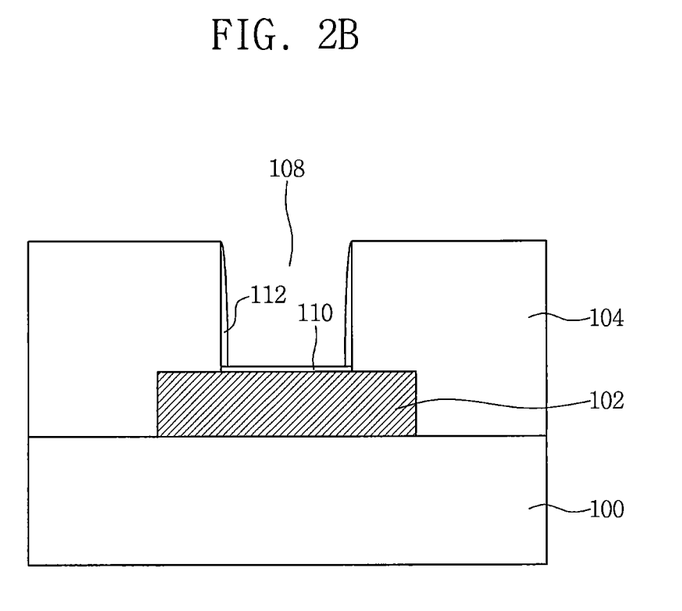
Figure 2C:
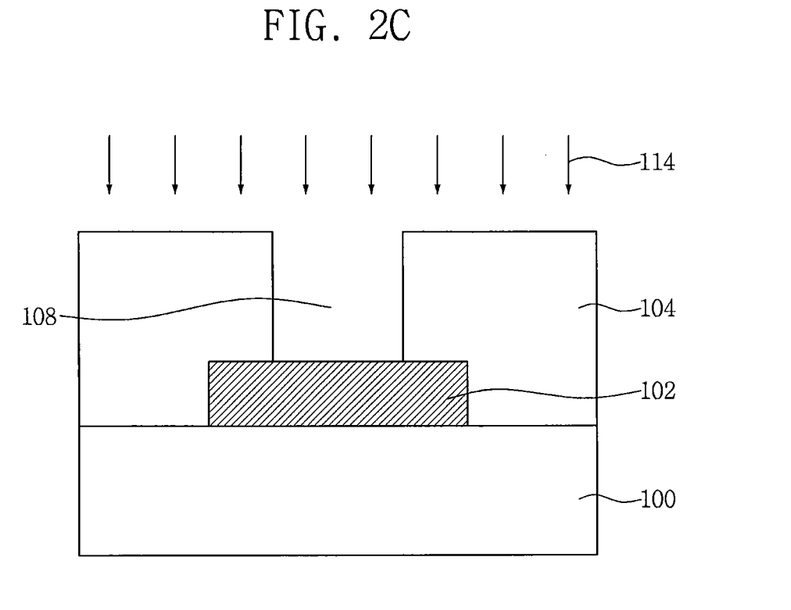

FIGS. 2A to 2C are cross-sectional views describing a method of cleaning a semiconductor device in accordance with an embodiment.

Referring to FIG. 2A, a metal layer pattern 102 may be formed on a substrate 100.

The substrate 100 may be a semiconductor substrate. For example, the substrate 100 may have a silicon substrate, a germanium substrate, or a silicon-germanium substrate.

The metal layer pattern 102 may be any one of a gate electrode, a bit line, and a metal wiring. The metal layer pattern 102 may include tungsten (W), aluminum (Al), titanium nitride (TiN), titanium aluminum (TiAl), or tantalum nitride (TaN).

An insulating layer 104 may be formed on the substrate 100 on which the metal layer pattern 102 is formed. The insulating layer 104 may include silicon oxide.

A photoresist pattern 106 may be formed on the insulating layer 104.

Referring to FIG. 2B, a contact hole 108 configured to expose the metal layer pattern 102 may be formed by etching the insulating layer 104 using the photoresist pattern 106 as a mask. The etching process may be performed by a dry plasma etching process. In an embodiment, a natural oxide layer 110 may be formed on a surface of the metal layer pattern 102 exposed by the contact hole 108.

Subsequently, the photoresist pattern 106 may be removed by an ashing process.

Polymer by-products 112 generated by the etching process of the insulating layer 104, and the ashing process of the photoresist pattern 106 may be attached on an inner wall of the contact hole 108. The polymer by-products 112 may include an organic polymer, a metal polymer, an oxide polymer, or a residue generated by removing the photoresist pattern 106. The polymer by-products 112 may increase the electrical resistance of the semiconductor device, or cause an electrical short between wires.

Referring to FIG. 2C, to remove the natural oxide layer 110 and polymer by-products 112, a cleaning process may be performed by supplying a cleaning solution composition 114 in accordance with the embodiment including organic solvent (IPA), fluoride compounds (HF and NH$_4$F), and deionized water (H$_2$O) on the substrate 100 on which the metal layer pattern 102 is exposed.

The cleaning solution composition 114 may include 98.7 to 99.6 wt % of organic solvent, 0.002 to 0.01 wt % of HF, 0.02 to 0.05 wt % of NH$_4$F, and 0.4 to 1.25 wt % of deionized water. The natural oxide layer 110 and the polymer with an oxide component are etched by the HF$_2^-$ generated from the fluoride compound, and the organic and metal polymer by-products peel off and dissolve in the cleaning solution composition 114. In an embodiment, a metal fluoride may be formed on the surface of the metal layer pattern 102 by a reaction of the fluoride compound and the metal, not dissolve in the organic solvent and remains. Therefore, the metal layer pattern 102 may not be etched, and the natural oxide layer 110 and the polymer by-products 112 may be removed, by the cleaning process using the cleaning solution composition 114 in accordance with the embodiment. The metal fluoride may be removed during a subsequent rinsing process.

The cleaning process may be performed at a room temperature, for example, within the temperature range of 10° C. to 30° C. in a batch type cleaning device or a single-wafer-type cleaning device.

The cleaning solution composition 114 may be provided by a spray method, a spin spray method, or a dipping method.

For example, the cleaning solution composition 114 may be continuously sprayed from an upper portion of the substrate 100. The cleaning solution composition 114 may constantly remain on the substrate 100 by spraying the cleaning solution composition 114 while rotating the substrate 100. Further, the cleaning solution composition 114 may be provided for the entire substrate 100 by fully dipping the substrate 100 in a container in which the cleaning solution composition 114 is contained.

After the cleaning process is completed, a rinse process is performed on the substrate 100 using deionized water, and thus, the organic and metal by-products, which delaminate from the substrate 100 by dissolving in the cleaning solution composition 114, and the cleaning solution composition 114 and the metal fluoride, which remains on the substrate 100 and the metal layer pattern 102, may be fully removed.

Subsequently, a drying process may be performed to remove the deionized water rinse that exists on the substrate 100 on which the natural oxide layer 110 and the polymer by-products 112 are removed.

FIGS. 3A to 3D are cross-sectional views describing a method of cleaning a semiconductor device in accordance with another embodiment.

Figure 3A:
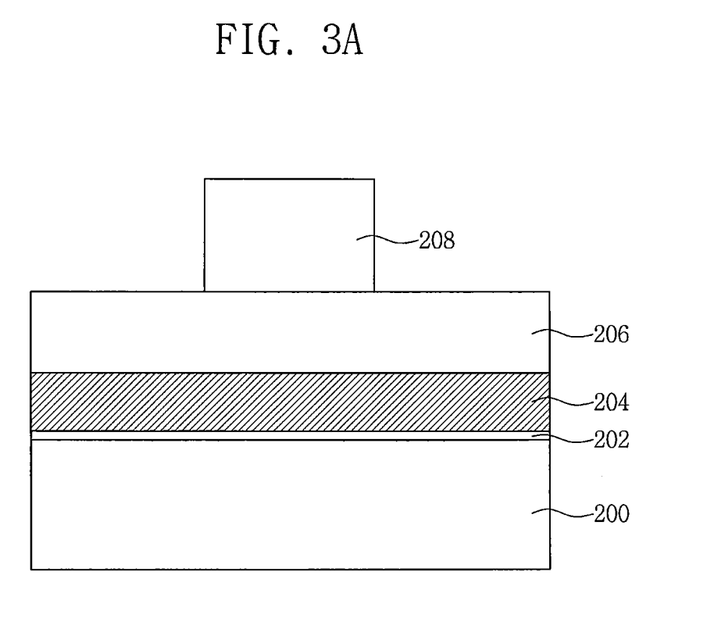
FIGS. 3A to 3D are cross-sectional views for describing a method of cleaning a semiconductor device in accordance with another embodiment.

Referring to FIG. 3A, a gate insulating layer 202, a metal gate layer 204, and a gate mask layer 206 may be stacked on a substrate 200.

The substrate 200 may be a semiconductor substrate. For example, the substrate 200 may have a silicon substrate, a germanium substrate, or a silicon-germanium substrate. The gate insulating layer 202 may include silicon oxide, or a dielectric material. The metal gate layer 204 may include tungsten (W), aluminum (Al), titanium nitride (TiN), titanium aluminum (TiAl), or tantalum nitride (TaN). The gate mask layer 206 may include silicon nitride, or silicon oxide.

A photoresist pattern 208 may be formed on the gate mask layer 206.

Figure 3B:
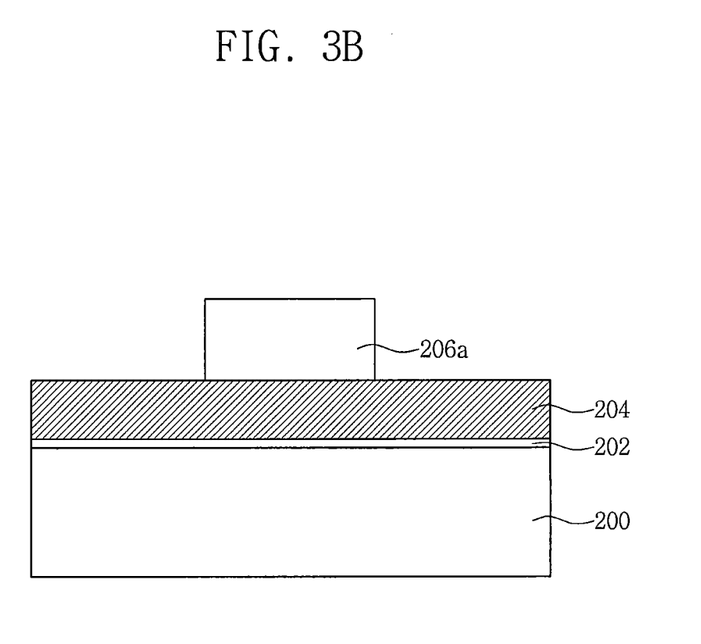

Referring to FIG. 3B, a gate mask layer pattern 206a may be formed by etching the gate mask layer 206 using the photoresist pattern 208 as a mask. The etching process may be performed by a dry plasma etching process.

The photoresist pattern 208 may be removed by an ashing process.

Figure 3C:
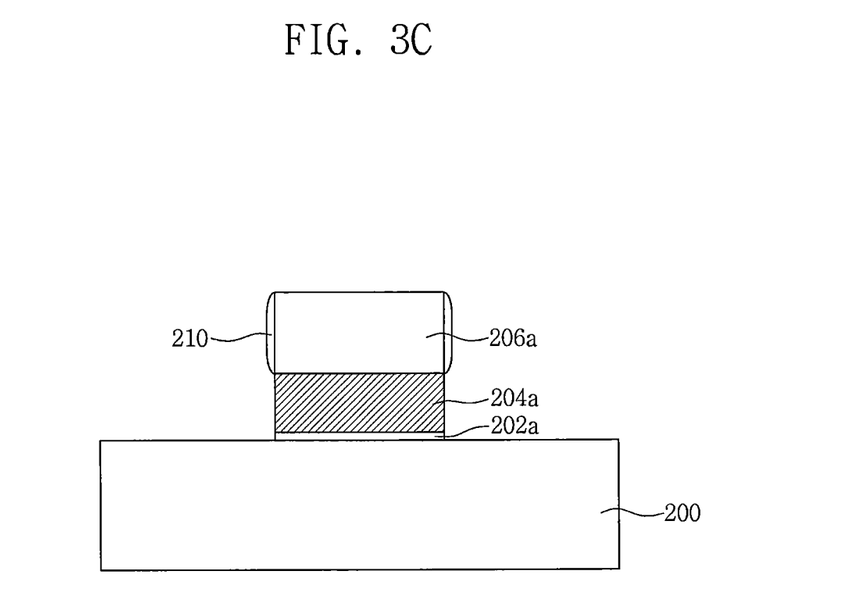

Referring to FIG. 3C, the metal gate layer 204 and the gate insulating layer 202 may be sequentially etched using the gate mask layer pattern 206a as a mask. As a result, a gate structure including a gate insulating layer pattern 202a, a metal gate layer pattern 204a, and the gate mask layer pattern 206a is formed.

Polymer by-products 210 including an organic polymer, a metal polymer, and an oxide polymer may be generated by an etching process for forming the gate structure. Further, the polymer by-products 210 may include residue generated by removing the photoresist pattern 208. The polymer by-products 210 may be mainly attached on a side wall of the gate mask layer pattern 206a. Since the polymer by-products 210 may increase the electrical resistance of the semiconductor device by remaining on a surface of the gate structure, or cause an electrical short adjacent to a gate structure, the polymer by-products 210 need to be removed.

Figure 3D:
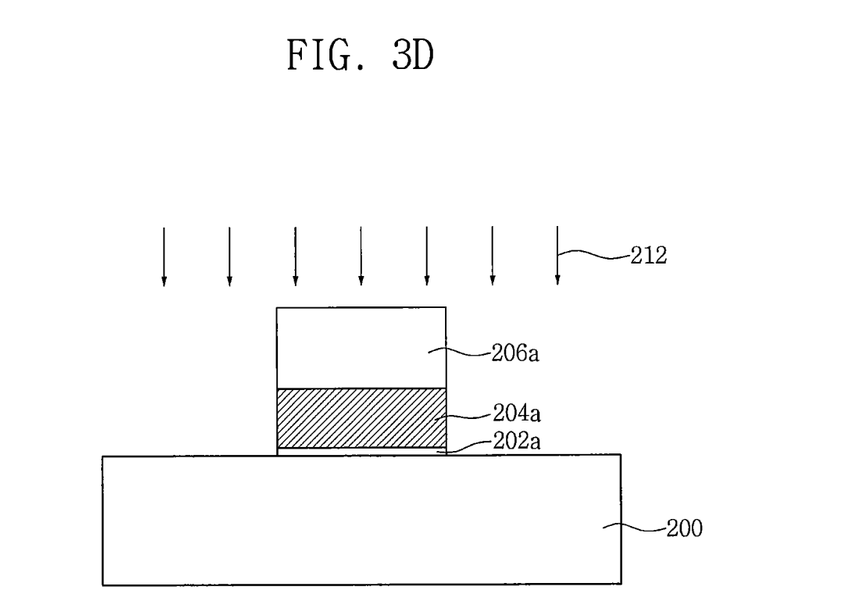

Referring to FIG. 3D, to remove the polymer by-products 210, a cleaning process may be performed by supplying a cleaning solution composition 212 in accordance with the embodiment including organic solvent (IPA), fluoride compounds (HF and $NH_4F$), and deionized water ($H_2O$) on the substrate 200 on which the gate structure is formed.

The cleaning solution composition 212 may include 98.7 to 99.6 wt % of organic solvent, 0.002 to 0.01 wt % of HF, 0.02 to 0.05 wt % of $NH_4F$, and 0.4 to 1.25 wt % of deionized water. The polymer with an oxide component is etched by the $HF_2^-$ generated from the fluoride compound, and organic and metal polymer by-products delaminate and dissolve in the cleaning solution composition 212. Here, a metal fluoride may be formed on a surface of the metal gate layer pattern 204a by a reaction of the fluoride compound and the metal, not dissolve in the organic solvent and remains. Therefore, etching of the metal gate layer pattern 204a may be prevented, and the polymer by-products 210 may be removed, by the cleaning process using the cleaning solution composition 212 in accordance with the embodiment.

The cleaning process may be performed at a room temperature, for example, within the temperature range of 10° C. to 30° C. in a batch type cleaning device or a single-wafer-type cleaning device. The cleaning solution composition 212 may be provided by a spray method, a spin spray method, or a dipping method.

After the cleaning process is completed, a rinse process is performed on the substrate 200 using deionized water, and thus, the organic and metal by-products, which delaminate from the substrate 200 by dissolving in the cleaning solution composition 212, and the cleaning solution composition 212 and the metal fluoride, which remain on the substrate 200, may be fully removed.

Subsequently, a drying process may be performed to remove deionized water rinse that exists on the substrate 200 on which the polymer by-products 210 are removed.

According to various embodiments of the inventive concept, a substrate having a pattern including a metal layer may be cleaned using a cleaning solution composition including an organic solvent in which a metal fluoride does not dissolve, at least one fluoride compound that generates $HF_2^-$, and deionized water.

The concentration of the deionized water may be 1.5 wt % or lower based on the total weight of the cleaning solution composition, and the organic solvent, in which the metal fluoride does not dissolve, may be used, thereby preventing the metal layer from being etched. Further, polymer by-products remaining on the substrate and the metal layer may be removed by the fluoride compound that generates $HF_2^-$. Therefore, since damage to a wiring pattern or a contact pattern including a metal layer may be prevented, and contaminants such as polymer by-products and the like may be effectively removed during a cleaning process, the reliability of the semiconductor device may be improved.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A cleaning solution composition, comprising:
   an organic solvent in which a metal fluoride does not dissolve;
   at least one fluoride compound that generates bifluoride ($HF_2^-$); and
   deionized water, wherein the deionized water is present in a concentration of 1.5 wt % or less based on the total weight of the cleaning solution composition, wherein the at least one fluoride compound includes hydrogen fluoride (HF) and ammonium fluoride ($NH_4F$), and wherein the concentration of HF is in a range of 0.002 wt % to 0.01 wt % based on the total weight of the cleaning solution composition and the concentration of $NH_4F$ is in a range of 0.02 wt % to 0.05 wt % based on the total weight of the cleaning solution composition.

2. The cleaning solution composition according to claim 1, wherein the organic solvent includes at least one of methyl alcohol, ethyl alcohol, propyl alcohol, or butyl alcohol.

3. The cleaning solution composition according to claim 1, wherein the organic solvent includes isopropyl alcohol (($CH_3$)$_2$CHOH).

4. The cleaning solution composition according to claim 1, wherein the concentration of the organic solvent is in a range of 98.7 wt % to 99.6 wt % based on the total weight of the cleaning solution composition.

5. The cleaning solution composition according to claim 1, wherein the at least one fluoride compound further includes ammonium hydrogen fluoride ($NH_4HF_2$).

6. The cleaning solution composition according to claim 1, wherein the concentration of the deionized water is in a range of 0.4 wt % to 1.25 wt % based on the total weight of the cleaning solution composition.

7. A method of cleaning a semiconductor device, comprising:

forming a pattern including a metal layer on a substrate; and cleaning the substrate using a cleaning solution composition including an organic solvent in which a metal fluoride does not dissolve, at least one fluoride compound that generates bifluoride ($HF_2^-$), and deionized water, the deionized water being present in a concentration of 1.5 wt % or less based on the total weight of the cleaning solution composition, wherein the at least one fluoride compound includes hydrogen fluoride (HF) and ammonium fluoride ($NH_4F$), and wherein the concentration of HF is in a range of 0.002 wt % to 0.01 wt % based on the total weight of the cleaning solution composition and the concentration of $NH_4F$ is in a range of 0.02 wt % to 0.05 wt % based on the total weight of the cleaning solution composition.

8. The method according to claim 7, wherein the organic solvent includes isopropyl alcohol (($CH_3$)$_2$CHOH).

9. The method according to claim 7, wherein the at least one fluoride compound further includes ammonium hydrogen fluoride ($NH_4HF_2$).

10. The method according to claim 7, wherein the cleaning solution composition includes 98.7 wt % to 99.6 wt % of isopropyl alcohol (($CH_3$)$_2$CHOH) based on the total weight of the cleaning solution composition, and 0.4 wt % to 1.25 wt % of deionized water based on the total weight of the cleaning solution composition.

11. The method according to claim 7, further comprising:

removing the cleaning solution composition from the substrate by rinsing the substrate with a deionized water composition after cleaning the substrate.

12. A cleaning solution composition, comprising:

an organic solvent in which a metal fluoride does not dissolve, the organic solvent present in a concentration in a range of 98.7 wt % to 99.6 wt % based on the total weight of the cleaning solution composition;

hydrogen fluoride (HF) present in a concentration in a range of 0.002 wt % to 0.01 wt % based on the total weight of the cleaning solution composition;

ammonium fluoride ($NH_4F$) present in a concentration in a range of 0.02 wt % to 0.05 wt % based on the total weight of the cleaning solution composition; and deionized water present in a concentration in a range of 0.4 wt % to 1.25 wt % based on the total weight of the cleaning solution composition.

13. The cleaning solution composition according to claim 12, wherein the organic solvent includes at least one of methyl alcohol, ethyl alcohol, propyl alcohol, or butyl alcohol.

14. The cleaning solution composition according to claim 12, wherein the organic solvent includes isopropyl alcohol (($CH_3$)$_2$CHOH).

15. The method according to claim 7, wherein cleaning the substrate is performed at a temperature in a range of 10° C. to 30° C.

* * * * *